(12) United States Patent
Chen et al.

(10) Patent No.: US 11,579,475 B2
(45) Date of Patent: Feb. 14, 2023

(54) DISPLAY APPARATUS AND METHOD OF CONTROLLING THE SAME

(71) Applicants: BOE MLED TECHNOLOGY CO., LTD., Beijing (CN); BOE TECHNOLOGY GROUP CO., LTD., Beijing (CN)

(72) Inventors: Yinwei Chen, Beijing (CN); Haiwei Sun, Beijing (CN)

(73) Assignees: BOE MLED TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/419,140

(22) PCT Filed: May 8, 2020

(86) PCT No.: PCT/CN2020/089203
§ 371 (c)(1),
(2) Date: Jun. 28, 2021

(87) PCT Pub. No.: WO2020/224638
PCT Pub. Date: Nov. 12, 2020

(65) Prior Publication Data
US 2022/0107519 A1     Apr. 7, 2022

(30) Foreign Application Priority Data
May 9, 2019   (CN) .......................... 201910383765.0

(51) Int. Cl.
*G02F 1/13*     (2006.01)
*G02F 1/1335*   (2006.01)
(Continued)

(52) U.S. Cl.
CPC ............ *G02F 1/1323* (2013.01); *G02F 1/137* (2013.01); *G02F 1/133528* (2013.01);
(Continued)

(58) Field of Classification Search
CPC ... G06F 3/04164; G06F 3/0416; G01R 31/52; G01R 31/2825; G02F 1/1323;
(Continued)

(56) References Cited

U.S. PATENT DOCUMENTS

2002/0084993 A1   7/2002   Taneya et al.
2013/0141476 A1   6/2013   Wu
(Continued)

FOREIGN PATENT DOCUMENTS

CN   101046944 A   10/2007
CN   102654994 A    9/2012
(Continued)

OTHER PUBLICATIONS

English Translation of CN 203365807 (Year: 2013).*
(Continued)

*Primary Examiner* — Patrick N Edouard
*Assistant Examiner* — Eboni N Giles
(74) *Attorney, Agent, or Firm* — IP & T Group LLP

(57) ABSTRACT

A method of controlling a display apparatus includes: when the display apparatus is in a privacy display mode, obtaining, by an image processor, a plurality of frames of display images according to a frame of original image, transmitting, by the image processor, the plurality of frames of images to a display controller; controlling, by the display controller, the display panel to display the plurality of frames of display images in sequence within a display time of the frame of original image, and controlling, by the display controller, the grating panel to form light-transmitting regions and non-light-transmitting regions that are alternately arranged when
(Continued)

the display panel displays each frame of display image, so as to limit an exit angle of light exiting from the display side of the display apparatus, the exit angle being within a range of a privacy viewing angle.

17 Claims, 6 Drawing Sheets

(51) Int. Cl.
*G02F 1/137* (2006.01)
*G09G 3/3208* (2016.01)
*G09G 3/36* (2006.01)
*H01L 27/32* (2006.01)

(52) U.S. Cl.
CPC ............. *G09G 3/3208* (2013.01); *G09G 3/36* (2013.01); *H01L 27/3232* (2013.01); *G02F 2201/30* (2013.01); *G02F 2201/44* (2013.01); *G02F 2202/28* (2013.01); *G09G 2320/068* (2013.01); *G09G 2320/0626* (2013.01); *G09G 2354/00* (2013.01); *G09G 2358/00* (2013.01)

(58) Field of Classification Search
CPC ............... G02F 1/133528; G02F 1/137; G02F 2201/30; G02F 2201/44; G02F 2202/28; G09G 3/3208; G09G 3/36; G09G 2320/0626; G09G 2320/068; G09G 2354/00; G09G 2358/00; H01L 27/3232
See application file for complete search history.

(56) References Cited

U.S. PATENT DOCUMENTS

| | | |
|---|---|---|
| 2013/0162924 A1 | 6/2013 | Sahouani et al. |
| 2016/0275875 A1 | 9/2016 | Wei |
| 2016/0282644 A1 | 9/2016 | Lin et al. |
| 2016/0329033 A1 | 11/2016 | Woo et al. |
| 2017/0139243 A1 | 5/2017 | Ma |
| 2017/0235188 A1* | 8/2017 | Large ................ G02F 1/133509 349/68 |
| 2019/0137813 A1 | 5/2019 | Wei |
| 2019/0212543 A1 | 7/2019 | Li |
| 2022/0043309 A1* | 2/2022 | Johnson ............ G02F 1/133536 |

FOREIGN PATENT DOCUMENTS

| | | | |
|---|---|---|---|
| CN | 103167113 A | 6/2013 | |
| CN | 203365807 * | 12/2013 | ........... G02F 1/1333 |
| CN | 104090417 A | 10/2014 | |
| CN | 104732168 A | 6/2015 | |
| CN | 104851394 A | 8/2015 | |
| CN | 105911737 A | 8/2016 | |
| CN | 106406530 A | 2/2017 | |
| CN | 106791797 A | 5/2017 | |
| CN | 107734118 A | 2/2018 | |
| CN | 110264967 A | 9/2019 | |
| JP | 2006-195388 A | 7/2006 | |
| KR | 20080060440 * | 2/2008 | ............. G02B 30/00 |
| WO | WO-2014048512 A1 * | 4/2014 | ......... G02B 27/2214 |

OTHER PUBLICATIONS

English Translation of KR 20080060440 (Year: 2008).*
English Translation of WO 2014048512 (Year: 2014).*
First Office Action of Priority Application No. CN 201910383765.0 dated Jan. 15, 2021.
The Second Office Action of Priority Application No. CN 201910383765.0 dated May 27, 2021.
The Third Office Action of Priority Application No. CN 201910383765.0 dated Oct. 9, 2021.
Fourth Office Action Issued by the Chinese Patent Office for Application No. 201910383765.0 dated Oct. 25, 2022.

* cited by examiner

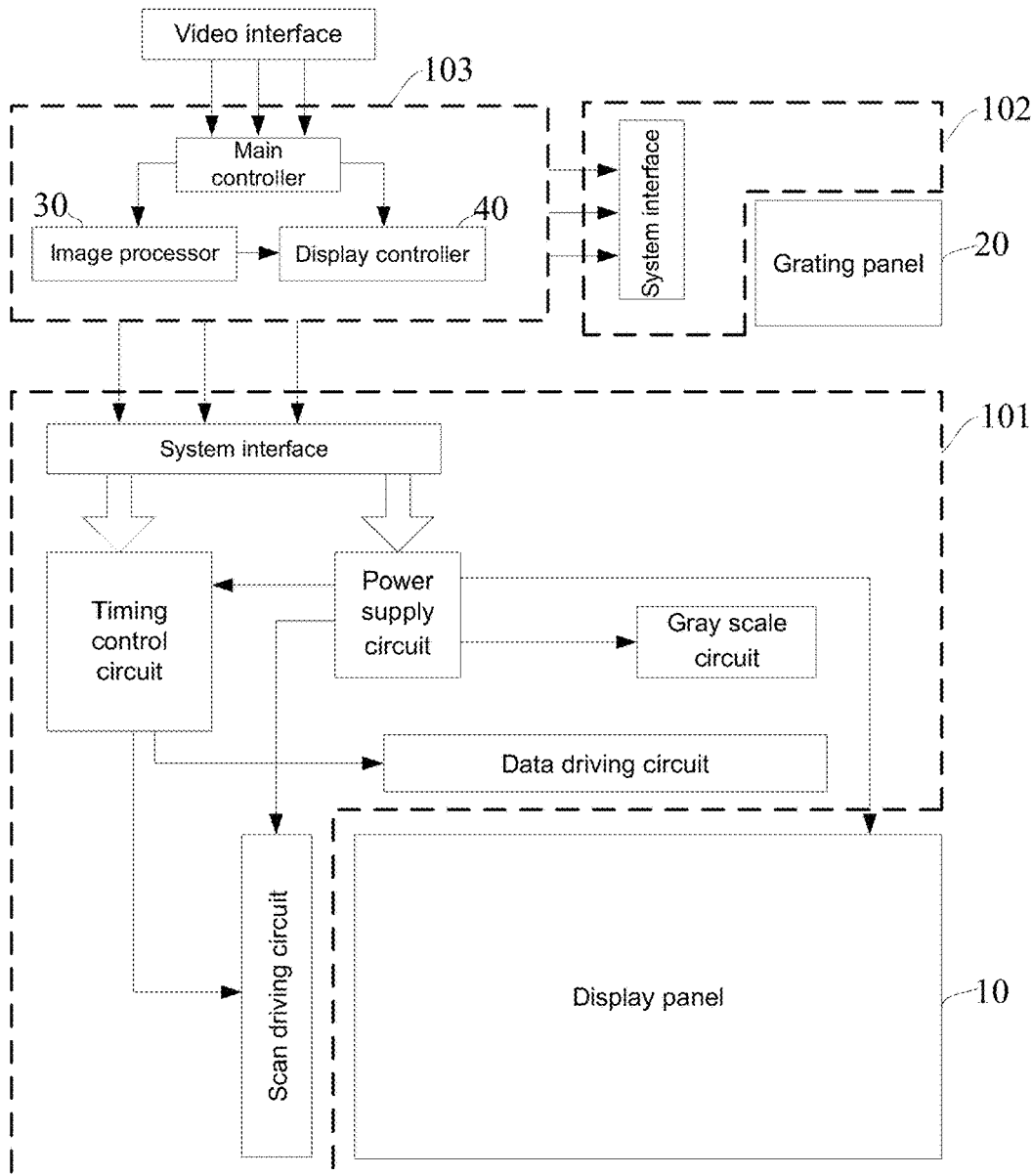

FIG. 2

When the display apparatus is in a privacy display mode, obtaining, by the image processor, a plurality of frames of display images according to a frame of original image, and transmitting, by the image processor, the plurality of frames of images to the display controller — S11

Controlling, by the display controller, the display panel to display the plurality of frames of display images in sequence within a display time of the frame of original image, and controlling, by the display controller, the grating panel to form light-transmitting regions and non-light-transmitting regions that are alternately arranged when the display panel displays each frame of display image, so as to limit an exit angle of light exiting from the display side of the display apparatus, the exit angle being within a range of a privacy viewing angle — S12

FIG. 3

DISPLAY APPARATUS AND METHOD OF CONTROLLING THE SAME

CROSS-REFERENCE TO RELATED APPLICATIONS

This application is a national phase entry under 35 USC 371 of International Patent Application No. PCT/CN2020/089203 filed on May 8, 2020, which claims priority to Chinese Patent Application No. 201910383765.0, filed on May 9, 2019, which are incorporated herein by reference in their entirety.

TECHNICAL FIELD

The present disclosure relates to the field of display technologies, and in particular, to a display apparatus and a method of controlling the same.

BACKGROUND

With the continuous development of display technologies, people's demand for display mode is more and more diversified, and users' protection consciousness of personal privacy is more and more strong. In some special application scenarios, e.g., in an office environment, people need screens of display apparatuses to be visible only to themselves and to be invisible to others, which is a privacy display mode. In some cases, the screens of the display apparatuses need to be viewed together with others, which is a shared display mode.

SUMMARY

In one aspect, a method of controlling a display apparatus is provided. The display apparatus includes a display panel, a grating panel disposed at a side of the display panel, an image processor and a display controller. The display apparatus has a display side and a non-display side. The method includes: when the display apparatus is in a privacy display mode, obtaining, by the image processor, a plurality of frames of display images according to a frame of original image; transmitting, by the image processor, the plurality of frames of display images to the display controller; controlling, by the display controller, the display panel to display the plurality of frames of display images in sequence within a display time of the frame of original image; and controlling, by the display controller, the grating panel to form light-transmitting regions and non-light-transmitting regions that are alternately arranged when the display panel displays each frame of display image, so as to limit an exit angle of light exiting from the display side of the display apparatus, the exit angle being within a range of a privacy viewing angle.

In some embodiments, obtaining, by the image processor, a plurality of frames of display images according to a frame of original image, includes: dividing, by the image processor, the frame of original image into a plurality of image columns in a row direction, each image column including a plurality of continuous columns of pixels; and extracting sequentially, by the image processor, part of image columns from the plurality of image columns, and using sequentially columns of pixels in the part of the image columns as pixel columns of one frame of display image, the pixel columns of the one frame of display image and the columns of pixels in the part of the image columns being at same positions, and gray scales of pixel columns at remaining positions of the frame of display image being 0.

In some embodiments, in a case where the plurality of frames of display images include two frames of display images, the two frames of display images include a first display image and a second display image; extracting sequentially, by the image processor, part of image columns from the plurality of image columns, and using sequentially columns of pixels in the part of the image columns as pixel columns of one frame of display image, the pixel columns of the one frame of display image and the columns of pixels in the part of the image columns being at same positions, includes: extracting, by the image processor, odd image columns from the plurality of image columns, and using columns of pixels in the odd image columns as first pixel columns of the first display image, the first pixel columns of the first display image and the columns of pixels in the odd image columns being at same positions, and gray scales of second pixel columns at remaining positions of the first display image being 0; and extracting, by the image processor, even image columns from the plurality of image columns, and using columns of pixels in the even image columns as third pixel columns of the second display image, the third pixel columns of the second display image and the columns of pixels in the even image columns being at same positions, and gray scales of fourth pixel columns at remaining positions of the second display image being 0.

In some embodiments, controlling, by the display controller, the grating panel to form light-transmitting regions and non-light-transmitting regions that are alternately arranged when the display panel displays each frame of display image, includes: generating, by the display controller, a grating drive signal according to each frame of display image; and transmitting, by the display controller, the grating drive signal to the grating panel, so that the grating panel forms the light-transmitting regions and the non-light-transmitting regions that are alternately arranged during the display panel displays each frame of display image.

In some embodiments, in a case where the plurality of frames of display images include two frames of display images, generating, by the display controller, a grating driving signal according to each frame of display image, includes: generating, by the display controller, a first grating driving signal according to the first display image; and generating, by the display controller, a second grating driving signal according to the second display image, wherein the first grating driving signal makes the grating panel and the display panel form a first matching state; in the first matching state, light passes through the light-transmitting regions of the grating panel and exits from pixel columns in the display panel corresponding to the first pixel columns of which gray scales are not 0 in the first display image, or light passes through the pixel columns in the display panel corresponding to the first pixel columns of which the gray scales are not 0 in the first display image and exits from the light-transmitting regions of the grating panel; and the second grating driving signal makes the grating panel and the display panel form a second matching state; and in the second matching state, light passes through the light-transmitting regions of the grating panel and exits from pixel columns in the display panel corresponding to the third pixel columns of which gray scales are not 0 in the second display image, or light passes through the pixel columns in the display panel corresponding to the third pixel columns of which the gray scales are not 0 in the second display image and exits from the light-transmitting regions in the grating panel.

In some embodiments, the method further includes: generating, by the image processor, brightness information of pixel columns of which gray scales are not 0 in each frame of display image according to each frame of display image, transmitting, by the image processor, the brightness information to the display controller; generating, by the display controller, a brightness driving signal according to the brightness information; and transmitting, by the display controller, the brightness driving signal to the grating panel, so that a portion of the grating panel corresponding to the light-transmitting region that is opposite to the pixel columns of which the gray scales are not 0 in each frame of displays image display gray scales corresponding to the brightness information.

In some embodiments, the method further includes: obtaining, by the image processor, position information of a viewer's eyes within the range of the privacy viewing angle, transmitting, by the image processor, the position information to the display controller; generating, by the display controller, a grating offset amount signal according to the position information, and transmitting, by the display controller, the grating offset amount signal to the grating panel, so that the grating panel adjusts positions of the light-transmitting regions and the non-light-transmitting regions according to the grating offset amount signal.

In some embodiments, the method further includes: determining, by the display controller, a pitch of two adjacent light-transmitting regions according to the range of the privacy viewing angle, a longitudinal distance between the display panel and the grating panel, and a width of a sub-pixel in the display panel.

In some embodiments, the method further includes: when the display apparatus is in a shared display mode, controlling, by the display controller, the display panel to display the original image, and controlling, by the display controller, the grating panel to form a full light-transmitting regions within a display time of the original image.

In another aspect, a display apparatus is provided. The display apparatus has a display side and a non-display side, and the display apparatus includes a display panel, a grating panel, an image processor and a display controller. The grating panel is disposed at a side of the display panel, and the display controller is electrically connected to the display panel, the grating panel and the image processor. When the display apparatus is in a privacy display mode, the grating panel is configured to form light-transmitting regions and non-light-transmitting regions that are alternately arranged; the image processor is configured to obtain a plurality of frames of display images according to a frame of original image; the display controller is configured to control the display panel to display the plurality of frames of display images in sequence within a display time of the frame of original image, and to control the grating panel to form the light-transmitting regions and the non-light-transmitting regions that are alternately arranged when the display panel displays each frame of display image, so as to limit an exit angle of light exiting from the display side of the display apparatus, the exit angle is within a range of a privacy viewing angle.

In some embodiments, the grating panel includes a liquid crystal grating. The display panel includes a liquid crystal display panel or an organic light-emitting diode display panel; the display panel and the grating panel are fixed together by an adhesive layer.

In some embodiments, in a case where the display panel includes the liquid crystal display panel, the display panel is closer to the display side of the display apparatus than the grating panel; or the grating panel is closer to the display side of the display apparatus than the display panel.

The display apparatus further includes a backlight module, and the backlight module is closer to the non-display side of the display apparatus than the grating panel and the display panel.

In some embodiments, in a case where the display panel includes the liquid crystal display panel, the display apparatus further includes a polarizer, the polarizer is disposed between the liquid crystal display panel and the grating panel. The polarizer is shared by a side of the liquid crystal panel proximate to the grating panel and a side of the grating panel proximate to the liquid crystal panel.

In some embodiments, in a case where the display panel includes the organic light-emitting diode display panel, the grating panel is closer to the display side of the display apparatus than the display panel.

In some embodiments, the image processor is further configured to obtain position information of a viewer's eyes within the range of the privacy viewing angle, and to transmit the position information to the display controller. The display controller is further configured to generate a grating offset amount signal according to the position information, and to transmit the grating offset amount signal to the grating panel, so that the grating panel adjusts positions of the light-transmitting regions and the non-light-transmitting regions according to the grating offset amount signal.

In some embodiments, the display controller is further configured to determine a pitch of two adjacent light-transmitting regions according to the range of the privacy viewing angle, a longitudinal distance between the display panel and the grating panel, and a width of a sub-pixel in the display panel.

In some embodiments, the display controller is further configured to control the display panel to display the original image and control the grating panel to form a full light-transmitting region within a display time of the original image when the display apparatus is in a shared display mode.

In yet another aspect, a computer-readable storage medium is provided. The computer-readable storage medium has stored computer program instructions thereon, when the computer program instructions run on a processor, the processor performs one or more steps in the method of controlling the display apparatus according to any one of the above embodiments.

In yet another aspect, a computer program product is provided. The computer program product includes computer program instructions that, when executed on a computer, cause the computer to perform one or more steps in the method of controlling the display apparatus according to any one of the above embodiments.

In yet another aspect, a computer program is provided. When executed on a computer, the computer program causes the computer to perform one or more steps in the method of controlling the display apparatus according to any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be

FIG. 2 is a circuit block diagram of a display apparatus, in accordance with some embodiments of the present disclosure;

FIG. 3 is a flow diagram of a method of controlling a display apparatus, in accordance with some embodiments of the present disclosure;

DETAILED DESCRIPTION

Figure 1A:
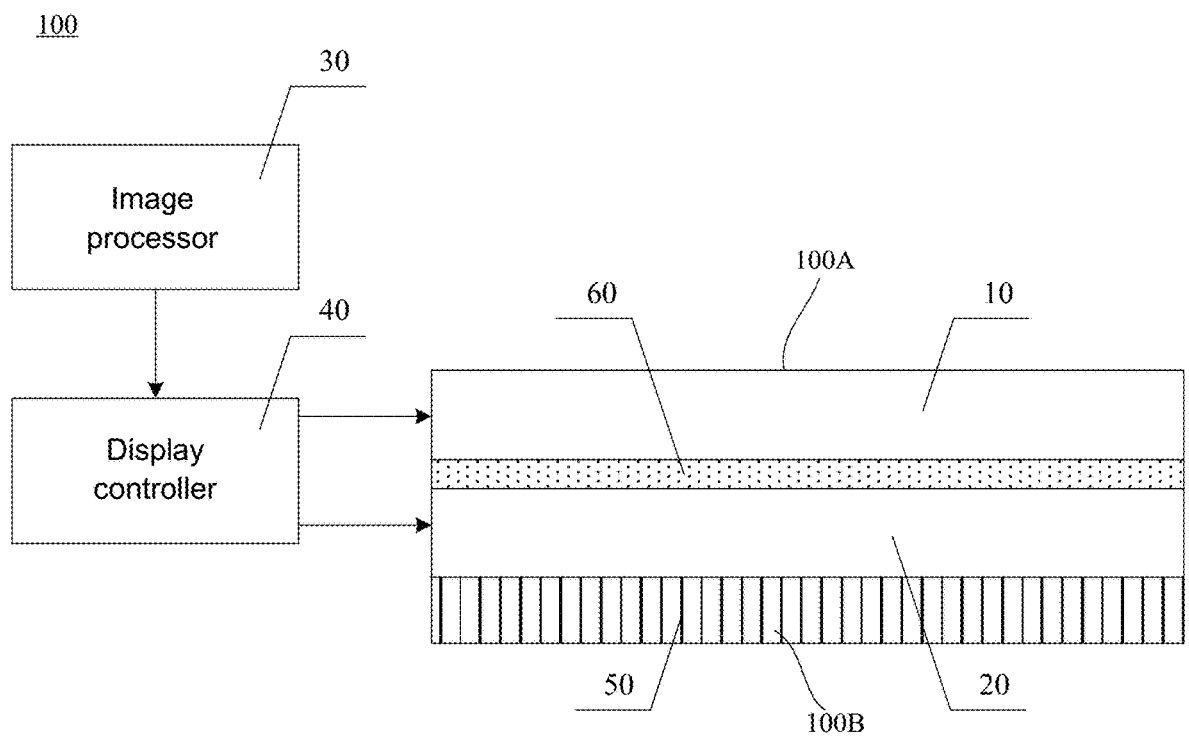
FIG. 1A is a structural diagram of a display apparatus, in accordance with some embodiments of the present disclosure.

Technical solutions in some embodiments of the present disclosure will be described below clearly and completely with reference to accompanying drawings. Obviously, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are only used for descriptive purposes, and are not to be construed as indicating or implying the relative importance or implicitly indicating the number of indicated technical features. Thus, features defined by "first" and "second" may explicitly or implicitly include one or more of the features. In the description of the embodiments of the present disclosure, "a plurality of" and "the plurality of" mean two or more unless otherwise specified.

In the description of some embodiments, the expressions "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The usage of "applicable to" or "configured to" herein means an open and inclusive language, which does not exclude apparatuses that are applicable to or configured to perform additional tasks or steps.

Exemplary embodiments are described herein with reference to sectional views and/or plan views as idealized exemplary drawings. In the accompanying drawings, thicknesses of layers and regions are enlarged for clarity. Thus, variations in shape relative to the accompanying drawings due to, for example, manufacturing technologies and/or tolerances may be conceivable. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in an apparatus, and are not intended to limit the scope of the exemplary embodiments.

In the description of embodiments of the present disclosure, it will be understood that orientations or positional relationships indicated by terms "center", "upper", "lower", "front", "rear", "vertical", "horizontal", "top", "bottom", "inner", "outer", etc. are based on orientations or positional relationships shown in the drawings, which is merely to facilitate and simplify the description of the present disclosure, and is not to indicate or imply that the referred apparatuses or elements must have a particular orientation, or must be constructed or operated in a particular orientation. Therefore they should not be construed as limitations to the present disclosure.

In the description of embodiments of the present disclosure, it will be noted that, terms "installed", "connected", "connection" shall be understood broadly, unless otherwise specified and restricted. For example, it may be a fixed connection, a detachable connection, or an integral connection; it may be a mechanical connection or an electrical connection; it may be directly connected or indirectly connected through an intermediate medium; it may be internal connection of two elements. Specific meanings of the above terms in the present disclosure shall be understood by a person of ordinary skilled in the art on a case-by-case basis.

Currently, in order to enable a display apparatus to be switched between a privacy display mode and a shared display mode, various solutions have been proposed in the related art. For example, a solution is to use a switchable privacy filter. The privacy filter is made of a polymer material or an inorganic material, and light transmittance of the privacy filter is switched by an electric driving mode, so as to achieve the privacy switch. Since the privacy filter needs a relatively thick base material to shield light from a side viewing angle, and a polymer material or inorganic material with a large-thickness may cause a greater light loss, this solution has problems such as low display brightness. For another example, another solution may achieve a privacy effect by controlling display states of pixels, i.e., by enabling pixels within a range of a privacy viewing angle to be in an on state, and enabling pixels outside the range of the privacy viewing angle to be in an off state. In this way, other people outside the range of the privacy viewing angle cannot observe the content displayed on the display apparatus. This solution causes low display resolution due to loss of some pixels outside the range of the privacy viewing angle.

In summary, the inventors of the present disclosure have found that the solutions in the related art have problems such as low display brightness or low display resolution, and cannot meet normal practical requirements.

Figure 1B:
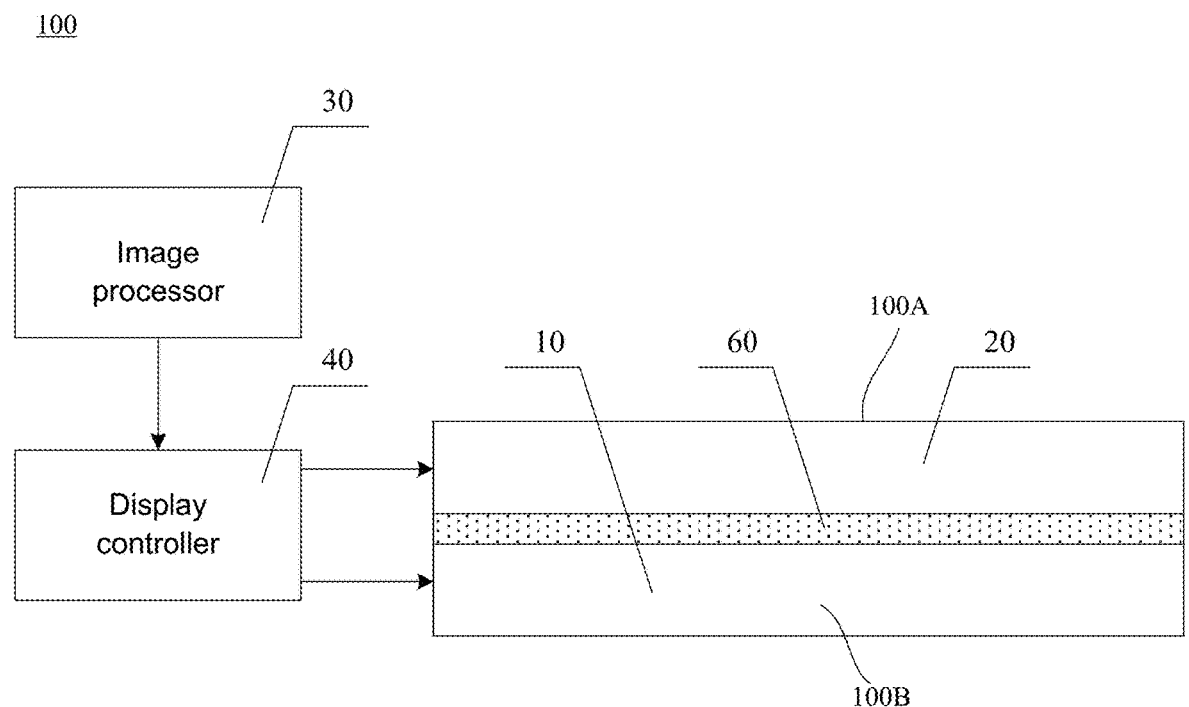
FIG. 1B is a structural diagram of a display apparatus, in accordance with some other embodiments of the present disclosure.

In view of this, embodiments of the present disclosure provide a display apparatus 100, and the display apparatus 100 has a display side 100A and a non-display side 100B. FIGS. 1A and 1B show structural diagrams of the display apparatus 100. The display apparatus 100 may be any product or component having a display function, such as a mobile phone, a tablet computer, a television, a display, a notebook computer, a digital photo frame, a navigator, or industrial medical care.

Referring to FIGS. 1A and 1B, the display apparatus 100 includes a display panel 10, a grating panel 20, an image processor 30 and a display controller 40. The grating panel 20 is disposed at a side of the display panel 10, and the display controller 40 is electrically connected to the display panel 10, the grating panel 20 and the image processor 30.

When the display apparatus 100 is in a privacy display mode, the grating panel 20 is configured to form light-transmitting regions and non-light-transmitting regions that are alternately arranged. The image processor 30 is configured to obtain a plurality of frames of display images according to a frame of original image. The display controller 40 is configured to control the display panel 10 to display the plurality of frames of display images in sequence within a display time of the frame of original image, and to control the grating panel 20 to form the light-transmitting regions and the non-light-transmitting regions that are alternately arranged when the display panel 10 displays each frame of display image, so as to limit an exit angle of light exiting from the display side 100A of the display apparatus 100, and the exit angle is within a range of a privacy viewing angle.

The image processor 30 in the display apparatus 100 may be implemented by a main controller on a main board of the display apparatus 100, or by a separate image processing chip. Embodiments of the present disclosure are not specifically limited thereto. The display controller 40 in the display apparatus 100 may be implemented by a driver chip, and the driver chip may be, for example, provided on the main board of the display apparatus 100.

In some embodiments, the display panel 10 may be, for example, a liquid crystal display (LCD) panel or an organic light-emitting diode (OLED) display panel 10. The grating panel 20 may be a liquid crystal grating, and the display panel 10 and the grating panel 20 are fixed together by an adhesive layer 60.

For example, FIG. 2 shows a possible circuit block diagram of the display apparatus 100. Referring to FIG. 2, the display apparatus 100 includes a display panel 10, a grating panel 20, a first circuit board 101 (also referred to as a timing controller (TCON) circuit board) coupled to the display panel 10, a second circuit board 102 coupled to the grating panel 20, and a main board 103 connected to the first circuit board 101 and the second circuit board 102. As shown in FIG. 2, a main controller and a video interface may be provided on the main board 103. The display controller 40 is connected to the main controller, and is connected to the first circuit board 101 and the second circuit board 102 through system interfaces respectively. The image processor 30 may be implemented by a main controller, or may be separately provided and connected to the main controller.

By taking an example in which the display panel 10 is a LCD display panel 10, a system interface connected to the main board 103 and various driving circuits of the display panel 10 may be provided on the first circuit board 101. The system interface may include a transistor-transistor logic (TTL) interface, a low voltage differential signaling (LVDS) interface, etc. The driving circuits of the display panel 10 may include a timing control circuit, a power supply circuit, a gray scale circuit, a data driving circuit, a scan driving circuit, etc. The second circuit board 102 may have a similar structure to the first circuit board 101, which is not shown in FIG. 2.

With reference to a circuit structure of the display apparatus 100, by taking an example in which the image processor 30 in the display apparatus 100 is implemented by the main controller, a working principle of the display apparatus 100 will be described as follows: video signals input from outside are transmitted to the main controller through the video interface, and the main controller generates various display data and timing control signals according to the video signals. A part of these data and signals are transmitted to the power supply circuit through the system interface to generate a power supply voltage required for the operation of various driving circuits and a liquid crystal deflection reference voltage. A part of these data and signals are transmitted to the timing control circuit through the system interfaces on the first circuit board 101 and the second circuit board 102, and the timing control circuit generates operation timings of the data driving circuit and the scan driving circuit, and an overall timing. The data driving circuit converts a digital signal related to the display data and from the timing control circuit into an analog voltage, and the analog voltage is output to a pixel electrode to form a voltage required by liquid crystal deflection. The gray scale circuit generates a reference voltage required by a digital-to-analog conversion portion of the data driving circuit, so that the data driving circuit converts the digital signal into the analog voltage based on the reference voltage. The scan driving circuit generates a high or low level digital voltage, and outputs it to a gate of a thin film transistor (TFT) switch to control a switching state of each row of pixels. Under a combined action of the scan driving circuit and the data driving circuit, liquid crystal molecules may be deflected to change their arrangement. The grating panel 20 forms light-transmitting regions and the non-light-transmitting regions that are alternately arranged by controlling deflection of the liquid crystal molecules in the grating panel 20. By controlling the deflection of the liquid crystal molecules in the display panel 10, light passing through the display panel 10 may be regularly refracted, and then filtered by a polarizer, so that the display panel 10 may display a corresponding image.

Based on the display apparatus 100 provided by the embodiments of the present disclosure, when the display apparatus 100 is in the privacy display mode, the image processor 30 may obtain a plurality of frames of display images according to a frame of original image, and under control of the display controller 40, the display panel 10 may display a plurality of frames of display images in sequence within a display time of the frame of original image. When the display panel 10 displays each frame of display image, the grating panel 20 may form the light-transmitting regions and the non-light-transmitting regions that are alternately arranged, which acts as a grating, to limit the exit angle of the light exiting from the display side 100A of the display apparatus 100, so that the exit angle of the light exiting from the display side 100A of the display apparatus 100 is within the range of the privacy viewing angle. In this way, a user within the range of the privacy viewing angle may normally see a display image, whereas other people outside the range of the privacy viewing angle may not see the display image, thereby realizing the privacy function.

The display apparatus 100 provided in the embodiments of the present disclosure may achieve the privacy function by using the grating panel 20 with a small thickness instead of the privacy filter. Therefore, compared with the solution in the related art of achieving privacy function based on the privacy filter, the display apparatus 100 provided in the embodiments of the present disclosure may improve display brightness. In addition, the display apparatus 100 provided in the embodiments of the present disclosure may divide a frame of original image into a plurality of frames of display images and display the plurality of frames of display images in sequence within a displaying time of the frame of original image, so as to display all pixels of the original image, so that the user may see a complete original image. Therefore, compared with the solution in the related art that the privacy effect is achieved by controlling a display state of each pixel, the embodiments of the present disclosure do not have the problem of pixel loss and may improve the display resolution.

In some embodiments, as shown in FIG. 1A, in a case where the display panel includes a liquid crystal display panel 10, the display apparatus 100 further includes a backlight module 50. The backlight module 50 is closer to the non-display side 100B of the display apparatus 100 than the grating panel 20 and the display panel 10. In this case, the display panel 10 is closer to the display side 100A of the display apparatus 100 than the grating panel 20, as shown in FIG. 1A. Alternatively, the grating panel 20 is closer to the display side 100A of the display apparatus 100 than the display panel 10.

The backlight module 50 and the display panel 10 or the grating panel 20 may be bonded together, or a certain distance may be provided therebetween. The backlight module 50 may include a light source, a light guide plate, and optical films. The light guide plate converts a point light source or a linear light source generated by the light source into a surface light source, and light from the surface light source is strengthened by the optical films and then emitted to the grating panel 20.

It will be understood that, in a case where the display panel 10 includes the liquid crystal display panel 10, the display panel 10 includes a plurality of gate lines arranged in parallel and a plurality of data lines arranged in parallel on a plane parallel to the display panel 10. The plurality of gate lines and the plurality of data lines are vertically intersected to define a plurality of sub-pixels that are regularly arranged in a matrix, and each sub-pixel emits light with a single color. Generally, three or four sub-pixels constitute a pixel unit, sub-pixels located in a same row are referred to as a pixel row, and sub-pixels located in a same column are referred to as a pixel column. On a plane perpendicular to the display panel 10, the display panel 10 includes an array substrate, a color filter substrate, and a liquid crystal layer filled therebetween. The liquid crystal deflection is controlled by thin film transistors in the array substrate, so that light passes through a color filter (CF) layer in the color filter substrate, thereby forming light with different gray scales and different colors.

In some embodiments, resolutions of both the display panel 10 and the grating panel 20 are the same, that is, the display panel 10 and the grating panel 20 have pixel rows and pixel columns with a same size and corresponding positions. In a case where the grating panel 20 is a liquid crystal grating, a structure thereof is substantially the same as a structure of the liquid crystal display panel 10, except that a color film layer is not provided in a color film substrate, so that only light with different gray scales is formed.

In some embodiments, the display apparatus further includes a polarizer disposed between the display panel 10 and the grating panel 20. Since the display panel 10 and the grating panel 20 are glued together by a thin adhesive layer 60, the polarizer may be shared by a side of the liquid crystal panel proximate to the grating panel 20 and a side of the grating panel 20 proximate to the liquid crystal panel, that is, only three polarizers are provided in a whole structural assembly composed of two panels, so as to save material cost.

In some embodiments, as shown in FIG. 1B, in a case where the display panel 10 includes an OLED display panel, the grating panel 20 is closer to the display side 100A of the display apparatus 100 than the display panel 10.

The OLED display panel includes a plurality of sub-pixels that are regularly arranged in a matrix, and each sub-pixel emits light with a single color. Since the OLED display panel is a self-luminous panel, the display apparatus 100 shown in FIG. 1B does not need to be provided with a backlight module, and the grating panel 20 may be disposed at a light-exiting side of the display panel 10. Generally, the OLED display panel uses a polarizer to prevent reflection of ambient light, and thus a lower substrate of the grating panel 20 does not need to be provided with a polarizer, and may be directly glued on the OLED display panel by vacuum bonding an optical clear adhesive (OCA).

In some embodiments, the image processor 30 is further configured to obtain position information of a viewer's eyes within the range of the privacy viewing angle, and to transmit the position information to the display controller 40. The display controller 40 is further configured to generate a grating offset amount signal according to the position information, and to transmit the grating offset amount signal to the grating panel 20, so that the grating panel 20 adjusts positions of the light-transmitting regions and the non-light-transmitting regions according to the grating offset amount signal.

Based on the above solution, the display controller 40 may obtain position and distance information of the viewer's eyes relative to the display panel 10 according to the position information of the viewer's eyes within the range of the privacy viewing angle, calculate optimal positions of the light-transmitting regions and the non-light-transmitting regions according to the position and distance information, and then compare the calculated optimal positions with preset positions to generate the grating offset amount signal. When a grating driving signal is transmitted to the grating panel 20 in a current frame or a next frame, the grating offset amount signal is also transmitted to the grating panel 20, so that the grating panel 20 adjusts the positions of the light-transmitting regions and the non-light-transmitting regions according to the grating offset amount signal, that is, the positions of the light-transmitting regions and the non-light-transmitting regions are adjusted to optimal matching positions. In this way, the privacy effect may be further ensured, and it may be ensured that the user within the range of the privacy visual angle may finally obtain a good display effect all the time.

In some embodiments, the display controller 40 is further configured to determine a pitch of two adjacent light-transmitting regions according to the range of the privacy viewing angle, a longitudinal distance between the display panel 10 and the grating panel 20, and a width of a sub-pixel in the display panel 10.

The longitudinal distance between the display panel 10 and the grating panel 20 refers to a predetermined longitudinal distance between pixel units of the display panel 10 and the grating panel 20. In the display apparatus 100 shown in FIG. 1A, the longitudinal distance includes a thickness of a lower substrate of the display panel 10, a thickness of an upper substrate of the grating panel 20, and a thickness of the adhesive layer 60. In the display apparatus 100 shown in FIG. 1B, the longitudinal distance includes a thickness of the lower substrate of the grating panel 20, a thickness of an upper substrate of the display panel 10, and the thickness of the adhesive layer 60.

In the embodiments of the present disclosure, different privacy viewing angle ranges, such as ±20°, ±30° or ±40°, may be set for different sizes of the display panel 10, which is not specifically limited in the embodiments of the present disclosure.

In addition, the pitch of two adjacent light-transmitting regions in the grating panel 20 is a sum of widths of a single light-transmitting region and a single non-light-transmitting region.

In some embodiments, there is a certain relationship between the pitch of two adjacent light-transmitting regions and the range of the privacy viewing angle, the longitudinal distance between the display panel 10 and the grating panel 20, and the width of the sub-pixel in the display panel 10. In a case where the range of the privacy viewing angle is set, an appropriate pitch of two adjacent light-transmitting regions in the grating panel 20 may be selected based on the above relationship, so that the display apparatus 100 may achieve the privacy function. Similarly, in a case where the range of the privacy viewing angle is not set, the range of the privacy viewing angle may be adjusted based on the above relationship to achieve adjustability of the range of the privacy viewing angle, thereby improving the feasibility of mass production.

For example, the pitch of two adjacent light-transmitting regions, the range of the privacy viewing angle, the longitudinal distance between the display panel 10 and the grating panel 20, and the width of the sub-pixel in the display panel 10 satisfy the following relational expression:

$$\frac{\tan(a)*2h}{n*50\%} < P < \frac{\tan(a)*2h}{n*30\%},$$

wherein P is the pitch of two adjacent light-transmitting regions, a is the range of the privacy viewing angle, h is the longitudinal distance between the display panel 10 and the grating panel 20, and n is the width of the sub-pixel in the display panel 10.

In some embodiments, the display controller 40 is further configured to control the display panel 10 to display the original image when the display apparatus 100 is in the shared display mode, and to control the grating panel 20 to form a full light-transmitting region within the display time of the original image.

It will be readily understood that, in a case where the grating panel 20 is a liquid crystal grating in a normally white mode, the grating panel 20 may form the full light-transmitting region when the display controller 40 does not apply a driving signal to the grating panel 20.

Based on the above solution, when the display apparatus 100 is in the shared display mode, light exiting from the backlight module 50 or the display panel 10 may completely transmit through the grating panel 20 without significant loss by controlling the grating panel 20 to form the full light-transmitting region, so that all viewing users may see the display image.

On a basis of the above display apparatus 100, the embodiments of the present disclosure further provide a method of controlling the display apparatus, and FIG. 3 shows a flow diagram of the method of controlling the display apparatus.

As shown in FIG. 3, the method of controlling the display apparatus includes:

S11, when the display apparatus 100 is in a privacy display mode, obtaining, by the image processor 30, a plurality of frames of display images according to a frame of original image, and transmitting, by the image processor 30, the plurality of frames of display images to the display controller 40.

S12, controlling, by the display controller 40, the display panel 10 to display the plurality of frames of display images in sequence within a display time of the frame of original image, and controlling, by the display controller 40, the grating panel 20 to form light-transmitting regions and non-light-transmitting regions that are alternately arranged when the display panel 10 displays each frame of display image, so as to limit an exit angle of light exiting from the display side 100A of the display apparatus 100, the exit angle being within a range of the privacy viewing angle.

The method of controlling the display apparatus provided by the embodiments of the present disclosure has the same beneficial effects as the display apparatus provided by the above embodiments, which may be referred to the relevant description in the embodiments of the display apparatus 100, and will not be repeated herein.

In some embodiments, obtaining, by the image processor 30, a plurality of frames of display images according to a frame of original image (i.e., S11), includes S110 and S111.

In S110, the image processor 30 divides one frame of original image into a plurality of image columns in a row direction, and each image column includes a plurality of continuous columns of pixels.

Figure 4:
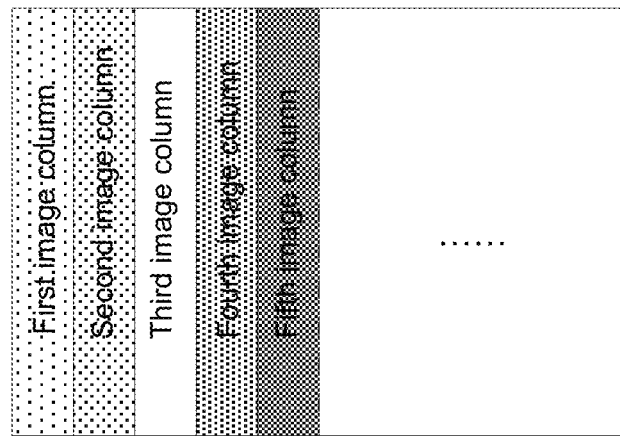
FIG. 4 is a schematic diagram showing a division of an original image, in accordance with some embodiments of the present disclosure.

For example, FIG. 4 shows a schematic diagram of dividing a frame of original image into a plurality of image columns in the row direction. As shown in FIG. 4, in the embodiments of the present disclosure, the frame of original image is divided into the plurality of image columns such as a first image column, a second image column, a third image column, a fourth image column, a fifth image column and the like, and the number of image columns is a positive integer greater than or equal to 2. For example, for a frame of original image with a resolution of 1920 by 1080, the frame of original image may be divided into 192 image columns, which includes 96 odd image columns and 96 even image columns, and each image column includes 10 pixel columns.

In S111, the image processor 30 sequentially extracts part of image columns from the plurality of image columns, and sequentially uses columns of pixels in the part of image columns as pixel columns of one frame of display image, the pixel columns of the one frame of display image and the columns of pixels in the part of image columns are at same positions, and gray scales of pixel columns at remaining positions of the frame of display image are 0.

Based on the above solution, the image processor 30 may obtain a plurality of frames of display images according to a frame of original image.

In some embodiments, in a case where the plurality of frames of display images include two frames of display images, the two frames of display images may include, for example, a first display image and a second display image. The image processor 30 sequentially extracts part of image columns from the plurality of image columns, and sequentially uses columns of pixels in the part of image columns as pixel columns of one frame of display image (i.e., S111), the pixel columns of the one frame of display image and the columns of pixels in the part of image columns are at same positions, includes:

extracting, by the image processor 30, odd image columns from the plurality of image columns, and using columns of pixels in the odd image columns as first pixel columns of the first display image, the first pixel columns of the first display image and the columns of pixels in the odd image columns being at same positions, and gray scales of second pixel columns at remaining positions of the first display image being 0; and extracting, by the image processor 30, even image columns from the plurality of image columns, and using columns of pixels in the even image columns as third pixel columns of the second display image, the third pixel columns of the second display image and the columns of pixels in the even image columns being at same positions, and gray scales of fourth pixel columns at remaining positions of the second display image being 0.

Figure 5A:
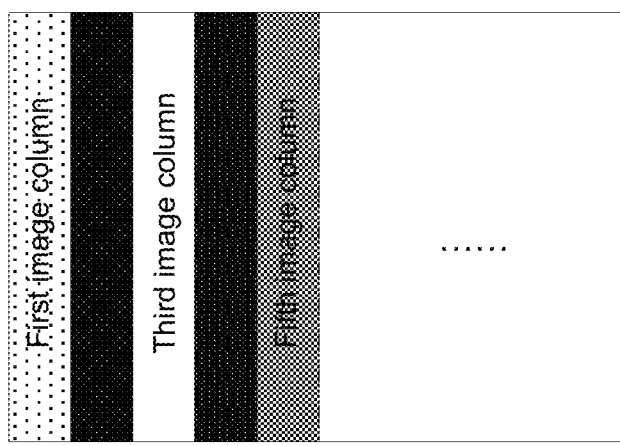
FIG. 5A is a schematic diagram of a first display image, in accordance with some embodiments of the present disclosure.
Figure 5B:
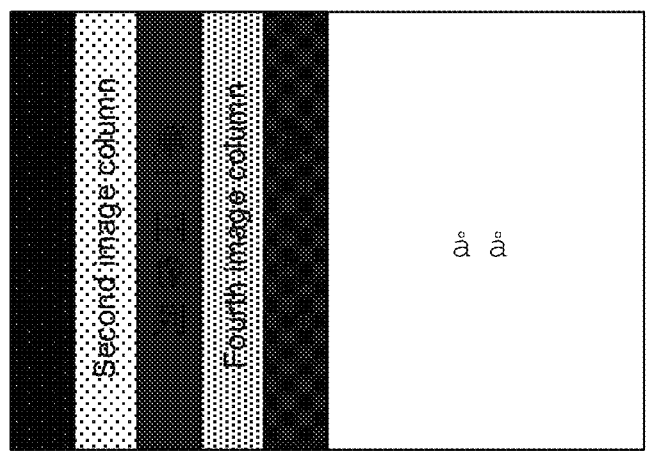
FIG. 5B is a schematic diagram of a second display image, in accordance with some embodiments of the present disclosure.

For example, following the previous example, assuming that the frame of original image is divided into a plurality of image columns, as shown in FIG. 4, the first display image obtained is as shown in FIG. 5A, and the second display image obtained is as shown in FIG. 5B. Referring to FIG. 5A, columns of pixels in the odd image columns (i.e., the first image column, the third image column, the fifth image column, etc.) in the plurality of image columns obtained by dividing the frame of original image may be used as first pixel columns of the first display image, the first pixel columns of the first display image and the columns of pixels in the odd image columns are at same positions, and the gray scales of second pixel columns at remaining positions of the first display image are set to be 0. Referring to FIG. 5B, columns of pixels in the even image columns (i.e., the second image column, the fourth image column, etc.) in the plurality of image columns obtained by dividing the frame of original image may be used as third pixel columns of the second display image, the third pixel columns of the second display image and the columns of pixels in the even image columns are at same positions, and the gray scales of fourth pixel columns at remaining positions of the second display image are set to be 0.

In some embodiments, controlling, by the display controller 40, the grating panel 20 to form light-transmitting regions and non-light-transmitting regions that are alternately arranged when the display panel 10 displays each frame of display image, includes:

generating, by the display controller 40, a grating driving signal according to each frame of display image; and transmitting, by the display controller 40, the grating driving signal to the grating panel 20, so that the grating panel 20 forms the light-transmitting regions and the non-light-transmitting regions that are alternately arranged during the display panel 10 displays each frame of display image.

The display controller 40 may, for example, transmit the grating driving signal simultaneously when transmitting each frame of display image to the display panel 10, so that the grating panel 20 forms the light-transmitting regions and the non-light-transmitting regions that are alternately arranged according to corresponding grating driving signal during the display panel 10 displays each frame of display image, thereby making the grating panel 20 and the display panel 10 form a matching state.

For example, in a case where the plurality of frames of display images include two frames of display images, i.e., the first display image and the second display image, generating, by the display controller 40, a grating driving signal according to each frame of display image, includes: generating, by the display controller 40, a first grating driving signal according to the first display image, and generating, by the display controller 40, a second grating driving signal according to the second display image.

The first grating driving signal makes the grating panel 20 and the display panel 10 form a first matching state. In the first matching state, light passes through the light-transmitting regions of the grating panel 20 and exits from pixel columns in the display panel 10 corresponding to the first pixel columns of which gray scales are not 0 in the first display image (in a case where the display panel 10 is closer to the display side 100A than the grating panel 20), or light passes through the pixel columns in the display panel 10 corresponding to the first pixel columns of which the gray scales are not 0 in the first display image and exits from the light-transmitting regions of the grating panel 20 (in a case where the grating panel 20 is closer to the display side 100A than the display panel 10).

The second grating driving signal makes the grating panel 20 and the display panel 10 form a second matching state. In the second matching state, light passes through the light-transmitting regions of the grating panel 20 and exits from pixel columns in the display panel 10 corresponding to the third pixel columns of which gray scales are not 0 in the second display image (in a case where the display panel 10 is closer to the display side 100A than the grating panel 20), or light passes through the pixel columns in the display panel 10 corresponding to the third pixel columns of which the gray scales are not 0 in the second display image and exits from the light-transmitting regions of the grating panel 20 (in a case where the grating panel 20 is closer to the display side 100A than the display panel 10).

Based on the solution of the embodiment of the present disclosure, the display controller 40 divides the display time of the frame of original image into two periods, i.e., a first period and a second period. The display controller 40 transmits one frame of display image in each period, which is equivalent to converting an original image with a low refresh frequency into an image with a high refresh frequency, and a privacy display may be achieved by increasing a refresh frequency and alternately switching display contents. For example, for an original image with a refresh frequency of 60 Hz, the first period and the second period are set to be T/2, where T is the display time of the frame of original image, i.e., one frame period, so that the display controller 40 controls the display panel 10 to display images at a high refresh frequency of 120 Hz. When the display panel 10 sequentially displays two frames of display images, the display panel 10 is equivalent to being equally divided into a plurality of display columns, and each display column displays a different image according to images transmitted by the display controller 40. In the first period, after the display controller 40 transmits the first display image to the display panel 10, since data of odd image columns in the first display image are original image data, and gray scales of even image columns in the first display image are 0, odd display columns of the display panel 10 display original image content, whereas even display columns of the display panel 10 display black, so that the user may only see images of the odd image columns of the original image from the odd display columns. In the second period, after the display controller 40 transmits the second display image to the display panel 10, since gray scales of odd image columns in the second display image are 0, and data of even image columns are original image data, even display columns of the display panel 10 display original image content, whereas odd display columns of the display panel 10 display black, so that the user may only see images of the even image columns of the original image from the even display columns. In this way, by alternately displaying two frames of display images in two periods within the display time of the frame of original image, the user may see the complete image of the original image.

Figure 6A:
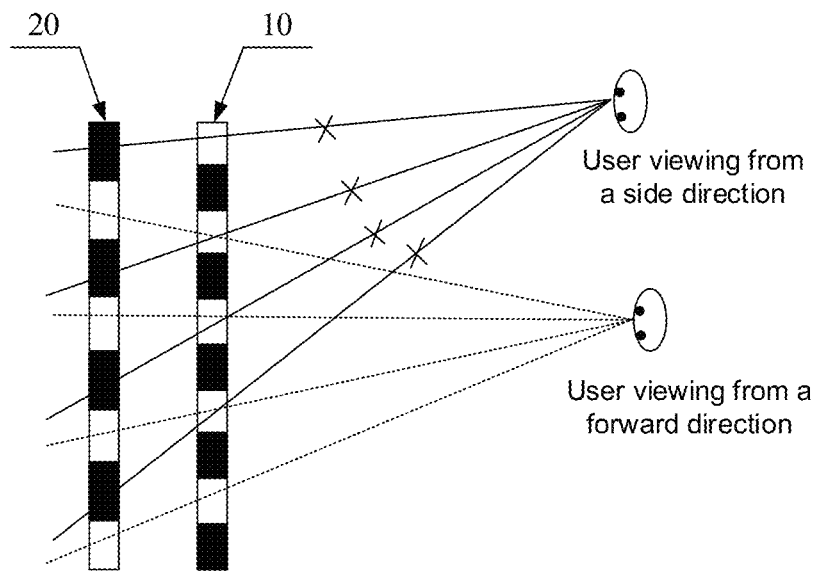
FIG. 6A is a schematic diagram of a privacy display, in accordance with some embodiments of the present disclosure.
Figure 6B:
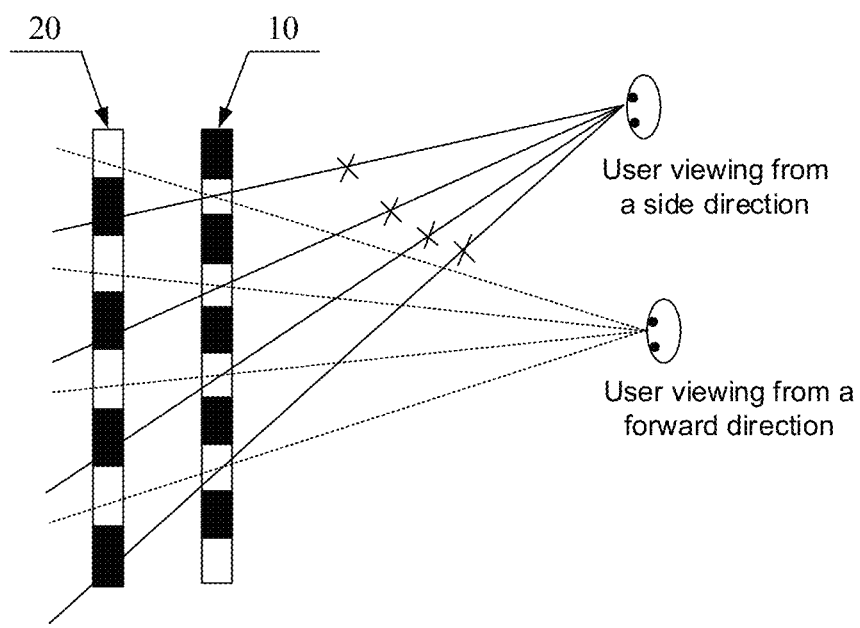
FIG. 6B is a schematic diagram of a privacy display, in accordance with some other embodiments of the present disclosure.

For example, FIGS. 6A and 6B show schematic diagrams of implementing privacy, in accordance with the embodiments of the present disclosure. In the first period, the display controller 40 transmits the first display image to the display panel 10, and the display panel 10 displays the first display image; the odd display columns display the original image picture (represented by white), whereas the even display columns display black (represented by black), as shown in FIG. 6A. Meanwhile, the display controller 40 transmits the first grating driving signal to the grating panel 20, so that grating columns corresponding to the odd display columns of the display panel 10 form light-transmitting regions (represented by white) relative to sight line of the user viewing from a forward direction, other grating columns form non-light-transmitting regions (represented by black). In this way, the display columns displaying the original image picture of the display panel 10 and the grating columns forming the light-transmitting regions of the grating panel 20 are in the first matching state, so that the user viewing from the forward direction may see the original image content displayed on the display panel 10, whereas the user viewing from a side direction cannot see the original image content displayed on the display panel 10. In the second period, the display controller 40 transmits the second display image to the display panel 10, and the display panel 10 displays the second display image; the odd display columns display black, whereas the even display columns display the original image picture, as shown in FIG. 6B. Meanwhile, the display controller 40 transmits the second grating driving signal to the grating panel 20, so as to switch grating columns previously forming the non-light-transmitting regions to the light-transmitting regions and switch grating columns previously forming the light-transmitting regions to the non-light-transmitting regions. In this way, the display columns displaying the original image picture of the display panel 10 and the grating columns forming the light-transmitting regions of the grating panel 20 are in the second matching state, so that the user viewing from the forward direction may still see the original image content displayed on the display panel 10, whereas the user viewing from the side direction cannot still see the original image content displayed on the display panel 10.

It will be noted that, in the embodiments of the present disclosure, for the display apparatus 100 shown in FIG. 1A, the user can see the original image content displayed on the display panel 10, which means that light exiting from the backlight module 50 can pass through the grating columns forming the light-transmitting regions of the grating panel 20 and the display columns displaying the original image picture of the display panel 10, and finally exit to a position where the user is located. Similarly, the user cannot see the original image content displayed on the display panel 10, which means that the light exiting from the backlight module 50 is either shielded by the grating columns forming the non-light-transmitting regions of the grating panel 20, or by the display columns displaying black of the display panel 10, and thus the light cannot exit to the position where the user is located. That is, the user's sight line is shielded by the display columns displaying black of the display panel 10 or by the grating columns forming the non-light-transmitting regions of the grating panel 20. Similarly, for the display apparatus 100 shown in FIG. 1B, the user can see the original image content displayed on the display panel 10, which means that light emitted from the display panel 10 can pass through the grating columns forming the light-transmitting regions of the grating panel 20, and exit to the position where the user is located. Similarly, the user cannot see the original image content displayed on the display panel 10, which means that the light emitted from the display panel 10 is shielded by the grating columns forming the non-light-transmitting regions of the grating panel 20, or by the display columns of the display panel 10 displaying black, and thus the light cannot exit to the position where the user is located. That is, the user's sight line is shielded by the display columns displaying black of the display panel 10 or by the grating columns forming the non-light-transmitting regions of the grating panel 20.

In some embodiments, the method further includes: generating, by the image processor 30, brightness information of pixel columns of which gray scales are not 0 in each frame of display image according to each frame of display image, and transmitting, by the image processor 30, the brightness information to the display controller 40. Generating, by the display controller 40, a brightness driving signal according to the brightness information; and transmitting, by the display controller 40, the brightness driving signal to the grating panel 20, so that a portion of the grating panel corresponding to the light-transmitting regions that is opposite to the pixel columns of which the gray scales are not 0 in each frame of display image displays gray scales corresponding to the brightness information.

In the above solution, when generating the plurality of frames of display images, the image processor 30 further generates brightness information of the pixel columns of which the gray scales are not 0 in each frame of display image (i.e., pixel columns of each image column in the original image) according to each frame of display image, and transmits the brightness information to the display controller 40. Further, when controlling the grating panel 20 to form a black-and-white grating in the first period and the second period, the display controller 40 further controls each light-transmitting region of the grating panel 20 to have a preset gray scale, and a gray scale of each light-transmitting region corresponds to brightness information of a corresponding image column. For example, the display controller 40 generates first brightness information according to the first image column of the original image, and transmits the first brightness information to the grating panel 20. When a first display column of the display panel 10 displays the first image column and a first grating column of the grating panel 20 is a light-transmitting region in the first period, the first brightness information is loaded to the first grating column, so that a region where the first grating column is located has a brightness corresponding to a brightness of the first image column. Based on the above solution, the grating panel 20 may effectively serve as a pixel filter simultaneously when forming the black-and-white grating, and thus, compared to a region-based backlight dimming display apparatus in the related art, the display apparatus 100 provided by the embodiments of the present disclosure may control the brightness more accurately, so as to obtain a high-contrast display effect and a high-dynamic-range (HDR) display function.

In some embodiments, the method of controlling the display apparatus further includes: obtaining, by the image processor 30, position information of the viewer's eyes within the range of the privacy viewing angle, and transmitting, by the image processor 30, the position information to the display controller 40; and generating, by the display controller 40, a grating offset amount signal according to the position information, and transmitting, by the display controller 40, the grating offset amount signal to the grating panel 20, so that the grating panel 20 adjusts positions of the light-transmitting regions and the non-light-transmitting regions according to the grating offset amount signal.

Based on the above solution, the display controller 40 may obtain position and distance information of the viewer's eyes relative to the display panel 10 according to the position information of the viewer's eyes within the range of the privacy viewing angle, calculate optimal positions of the light-transmitting regions and the non-light-transmitting regions according to the position and distance information, and then compare the calculated optimal positions with preset positions to generate the grating offset amount signal. When a grating driving signal is transmitted to the grating panel 20 in a current frame or a next frame, the grating offset amount signal is also transmitted to the grating panel 20, so that the grating panel 20 adjusts the positions of the light-transmitting regions and the non-light-transmitting regions according to the grating offset amount signal, that is, the positions of the light-transmitting regions and the non-light-transmitting regions are adjusted to optimal matching positions. In this way, the privacy effect may be further ensured, and it may be ensured that the user within the range of the privacy visual angle may finally obtain a good display effect all the time.

In some embodiments, the method of controlling the display apparatus further includes: determining, by the display controller 40, a pitch of two adjacent light-transmitting regions according to the range of the privacy viewing angle, a longitudinal distance between the display panel 10 and the grating panel 20, and a width of a sub-pixel in the display panel 10.

A specific method for the display controller 40 to determine the pitch of two adjacent light-transmitting regions according to the range of the privacy viewing angle, the longitudinal distance between the display panel 10 and the grating panel 20, and the width of the sub-pixel in the display panel 10 may refer to relevant description in the embodiments of the display apparatus 100, which will not be repeated herein.

In the solution in the related art that a combined structure of a liquid crystal grating and the display panel 10 is used to achieve a privacy display, in order to ensure the privacy effect, a width of the non-light-transmitting regions of the liquid crystal grating needs to be set to be more than twice of a width of the light-transmitting regions. In this case, transmittance is low, light loss is large, display brightness is reduced by 50% to 60% due to the light loss caused by the non-light-transmitting regions formed by the grating panel 20, display resolution is reduced, and picture loss is large. In contrast, since the display panel 10 in the present embodiments alternately displays odd image columns and even image columns of the original image at a high refresh frequency, while the grating panel 20 sequentially forms corresponding grating patterns at a high refresh frequency, and refresh time of the display panel 10 and refresh time of the grating panel 20 are synchronized, the width of the non-light-transmitting regions may be reduced on a premise of ensuring the privacy effect, thereby reducing the light loss and improving the display brightness. The calculation simulation result shows that when a ratio of the width of the light-transmitting regions of the grating panel 20 is set to be 30% to 50%, that is, when the width of the non-light-transmitting regions is 1 to 1.5 times of the width of the light-transmitting regions, a high transmittance of more than 40% may be achieved. Compared to the related art, the display brightness may be improved, the resolution may be improved, and the picture loss may be reduced, and the problems of low display brightness, low display resolution, large picture loss and the like in the related art may be effectively solved.

In some embodiments, considering that a pitch between pixels of the display panel 10 and the grating panel 20 is relatively close, a moiré phenomenon may occur. In order to eliminate the moiré phenomenon, on one hand, a wider pixel arrangement period may be used to ensure that a display image does not have an obvious fringe effect, and on the other hand, an inclined pixel structure may be designed to reduce the moiré phenomenon. The inclined pixel structure refers to changing superimposability of the pixels of the display panel 10 and the grating panel 20 by fine-tuning long and short sides and directions of the pixels when a pixel shape is designed. In order to obtain a clear and smooth display effect, a refresh frequency of the original image is set to be greater than or equal to 60 Hz, and the display panel 10 performs display at a refresh frequency of 120 Hz or more.

In some embodiments, the method of controlling the display apparatus further includes: when the display apparatus 100 is in the shared display mode, controlling, by the display controller 40, the display panel 10 to display the original image, and controlling, by the display controller 40, the grating panel 20 to form a full light-transmitting region within a display time of the original image.

Based on the above solutions, the display apparatus 100 provided by the embodiments of the present disclosure may achieve two display modes, i.e., the privacy display mode and the shared display mode. In the shared display mode, the image processor 30 does not need to divide the original image, and directly transmits a frame of original image to the display controller 40. The display controller 40 transmits the frame of image to the display panel 10, and transmits a driving signal for controlling the formation of the full light-transmission region to the grating panel 20. And the display panel 10 is driven at a refresh frequency (e.g., 60 Hz) of the original image, and directly displays the image after receiving the image. For the normally white liquid crystal grating, the display controller 40 may not transmit the driving signal to it, i.e., the liquid crystal grating does not need to be driven, and the light exiting from the backlight module 50 may completely pass through the liquid crystal grating without significant loss.

In actual implementation, the method of controlling the display apparatus provided by the embodiments of the present disclosure may further include a mode selection step, which is set before S11. When the display controller 40 determines that the privacy display mode is used, S11 and S12 are performed to achieve the privacy display mode. When the display controller 40 determines that the shared display mode is used, the display controller 40 instructs the image processor 30 to directly transmit the original image to the display controller 40, and then the display controller 40 transmits the original image to the display panel 10 for display, thereby achieving shared display. In this way, the embodiments of the present disclosure may achieve switching of the privacy mode within the range of the privacy viewing angle (e.g., a forward viewing angle of ±30°) and the shared mode within a range of a full viewing angle.

Figure 7A:
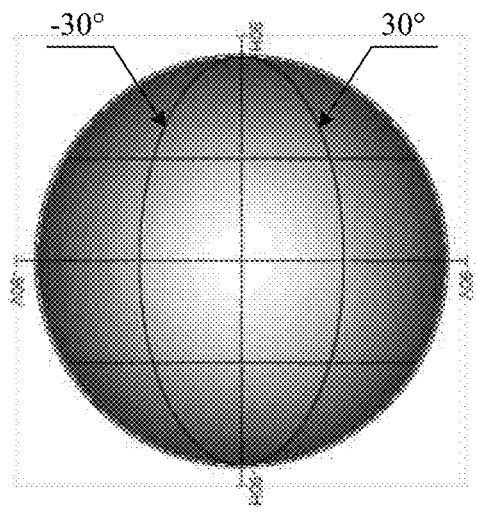
FIG. 7A is a distribution diagram showing a viewing angle-brightness relationship of a display apparatus in a shared display mode, in accordance with some embodiments of the present disclosure.
Figure 7B:
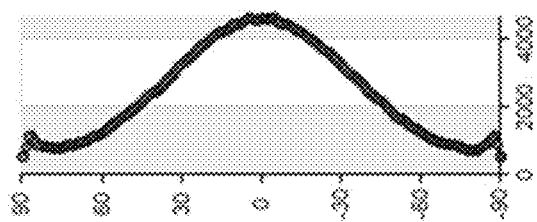
FIG. 7B is a curve diagram showing a relationship between viewing angle and brightness in FIG. 7A.
Figure 8A:
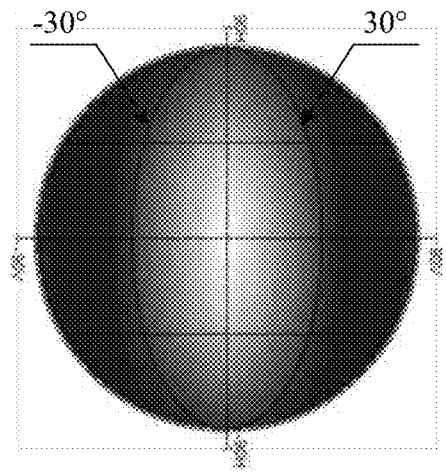
FIG. 8A is a distribution diagram showing a viewing angle-brightness relationship of a display apparatus in a privacy display mode, in accordance with some embodiments of the present disclosure.
Figure 8B:
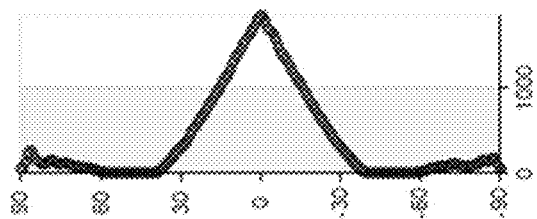
FIG. 8B is a curve diagram showing a relationship between viewing angle and brightness in FIG. 8A.

For example, the display apparatus 100 shown in FIGS. 1A and 1B is constructed by using optical simulation software in the embodiments of the present disclosure, and light intensities at different viewing positions are recorded by a receiver, so as to obtain viewing angle-brightness relationship distribution diagrams of the display apparatus 100 in the shared display mode and the privacy display mode, referring to FIGS. 7A to 8B. FIGS. 7A and 7B are viewing angle-brightness relationship distribution diagrams of the display apparatus 100 in the shared display mode, and FIGS. 8A and 8B are viewing angle-brightness relationship distribution diagrams of the display apparatus 100 in the privacy display mode. In FIGS. 7A and 8A, black lines represent viewing angles, for example, a longitudinal line indicated by 30° in the figures represents a viewing angle of 30°, and color shades represent brightness; white regions in the figures represent high brightness, and black regions represent low brightness. In FIGS. 7B and 8B, an abscissa is the viewing angle, and an ordinate is the brightness. As shown in FIGS. 7A and 7B, in the shared display mode, it may be seen that light has an energy distribution in a viewing angle range of −90° to 90°, and a brightness at the viewing angle of ±30° is approximately ½ of a brightness at a central viewing angle (0°). As shown in FIGS. 8A and 8B, in the privacy display mode, a brightness outside the viewing angle of ±30° is substantially close to 0, which not only effectively achieves the privacy display function, but also has a remarkable privacy effect.

Similarly, in the embodiments of the present disclosure, in the shared display mode, an HDR display effect may also be achieved through the grating panel 20 to improve the display effect.

Some embodiments of the present disclosure provide a computer-readable storage medium (e.g. a non-transitory computer-readable storage medium). The computer readable storage medium has stored computer program instructions thereon, when the computer program instructions run on a processor, the processor performs one or more steps in the method of controlling the display apparatus as described in any one of the above embodiments.

For example, the computer-readable storage medium may include, but is not limited to a magnetic storage device (e.g., a hard disk, a floppy disk or a magnetic tape), an optical disk (e.g., a compact disk (CD), a digital versatile disk (DVD)), a smart card and a flash memory device (e.g., an erasable programmable read-only memory (EPROM), a card, a stick or a key driver). Various computer-readable storage media described in the present disclosure may represent one or more devices for storing information and/or other machine-readable storage media. The term "machine-readable storage media" may include, but is not limited to, wireless channels and other various media capable of storing, containing and/or carrying instructions and/or data.

Some embodiments of the present disclosure also provide a computer program product. The computer program product includes computer program instructions that, when executed on a computer, cause the computer to perform one or more steps in the method of controlling the display apparatus as described in the above embodiments.

Some embodiments of the present disclosure also provide a computer program. When executed on a computer, the computer program causes the computer to perform one or more steps in the method of controlling the display apparatus as described in the above embodiments.

The computer-readable storage medium, the computer program product and the computer program have the same beneficial effects as the method of controlling the display apparatus as described in some embodiments of the present disclosure, which will not be described herein again.

The foregoing descriptions are merely specific implementations of the present disclosure, but the protection scope of the present disclosure is not limited thereto, and changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A method of controlling a display apparatus, the display apparatus including a display panel, a grating panel disposed at a side of the display panel, an image processor and a display controller, and the display apparatus having a display side and a non-display side; the method comprising:
when the display apparatus is in a privacy display mode, obtaining, by the image processor, two frames of display images according to a frame of original image,
transmitting, by the image processor, the two frames of display images to the display controller;
controlling, by the display controller, the display panel to display the plurality of two frames of display images in sequence within a display time of the frame of original image, and
controlling, by the display controller, the grating panel to form light-transmitting regions and non-light-transmitting regions that are alternately arranged when the display panel displays each frame of display image, so as to limit an exit angle of light exiting from the display side of the display apparatus; the exit angle being within a range of a privacy viewing angle, wherein
obtaining, by the image processor, the two frames of display images according to the frame of original image, includes:
dividing, by the image processor, the frame of original image into a plurality of image columns in a row direction, each image column including a plurality of continuous columns of pixels; and extracting sequentially, by the image processor, part of image columns from the plurality of image columns, and using sequentially columns of pixels in the part of the image columns as pixel columns of one frame of display image, the pixel columns of the one frame of display image and the columns of pixels in the part of the image columns being at same positions, and gray scales of pixel columns at remaining positions of the one frame of display image being 0;

the two frames of display images include a first display image and a second display image; and extracting sequentially, by the image processor, the part of the image columns from the plurality of image columns, and using sequentially the columns of pixels in the part of the image columns as the pixel columns of the one frame of display image, the pixel columns of the one frame of display image and the columns of pixels in the part of the image columns being at the same positions, includes:

extracting, by the image processor, odd image columns from the plurality of image columns, and using columns of pixels in the odd image columns as first pixel columns of the first display image, the first pixel columns of the first display image and the columns of pixels in the odd image columns being at same positions, and gray scales of second pixel columns at remaining positions of the first display image being 0; and extracting, by the image processor, even image columns from the plurality of image columns, and using columns of pixels in the even image columns as third pixel columns of the second display image, the third pixel columns of the second display image and the columns of pixels in the even image columns being at same positions, and gray scales of fourth pixel columns at remaining positions of the second display image being 0.

2. The method according to claim 1, wherein controlling, by the display controller, the grating panel to form light-transmitting regions and non-light-transmitting regions that are alternately arranged when the display panel displays each frame of display image, includes:

generating, by the display controller, a grating driving signal according to each frame of display image; and transmitting, by the display controller, the grating driving signal to the grating panel, so that the grating panel forms the light-transmitting regions and the non-light-transmitting regions that are alternately arranged during the display panel displays each frame of display image.

3. The method according to claim 2, wherein generating, by the display controller, a grating driving signal according to each frame of display image, includes:

generating, by the display controller, a first grating driving signal according to the first display image; and generating, by the display controller, a second grating driving signal according to the second display image, wherein the first grating driving signal makes the grating panel and the display panel form a first matching state; and in the first matching state, light passes through the light-transmitting regions of the grating panel and exits from pixel columns in the display panel corresponding to the first pixel columns of which gray scales are not 0 in the first display image, or light passes through the pixel columns in the display panel corresponding to the first pixel columns of which the gray scales are not 0 in the first display image and exits from the light-transmitting regions of the grating panel; and the second grating driving signal makes the grating panel and the display panel form a second matching state; and in the second matching state, light passes through the light-transmitting regions of the grating panel and exits from pixel columns in the display panel corresponding to the third pixel columns of which gray scales are not 0 in the second display image, or light passes through the pixel columns in the display panel corresponding to the third pixel columns of which the gray scales are not 0 in the second display image and exits from the light-transmitting regions in the grating panel.

4. The method according to claim 1, further comprising:

generating, by the image processor, brightness information of pixel columns of which gray scales are not 0 in each frame of display image according to each frame of display image, transmitting, by the image processor, the brightness information to the display controller;

generating, by the display controller, a brightness driving signal according to the brightness information; and transmitting, by the display controller, the brightness driving signal to the grating panel, so that a portion of the grating panel corresponding to the light-transmitting regions that is opposite to the pixel columns of which the gray scales are not 0 in each frame of display image displays gray scales corresponding to the brightness information.

5. The method according to claim 1, further comprising:

obtaining, by the image processor, position information of a viewer's eyes within the range of the privacy viewing angle, transmitting, by the image processor, the position information to the display controller;

generating, by the display controller, a grating offset amount signal according to the position information, and transmitting, by the display controller, the grating offset amount signal to the grating panel, so that the grating panel adjusts positions of the light-transmitting regions and the non-light-transmitting regions according to the grating offset amount signal.

6. The method according to claim 1, further comprising:

determining, by the display controller, a pitch of two adjacent light-transmitting regions according to the range of the privacy viewing angle, a longitudinal distance between the display panel and the grating panel, and a width of a sub-pixel in the display panel.

7. The method according to claim 1, further comprising:

when the display apparatus is in a shared display mode, controlling, by the display controller, the display panel to display the original image, and controlling, by the display controller, the grating panel to form a full light-transmitting region within a display time of the original image.

8. A non-transitory computer-readable storage medium having stored computer program instructions thereon, wherein when the computer program instructions run on a processor, the processor performs one or more steps in the method of controlling the display apparatus according to claim 1.

9. The method according to claim 1, wherein controlling, by the display controller, the grating panel to form light-transmitting regions and non-light-transmitting regions that are alternately arranged when the display panel displays each frame of display image, includes:
  generating, by the display controller, a grating driving signal according to each frame of display image; and
  transmitting, by the display controller, the grating driving signal to the grating panel, so that the grating panel forms the light-transmitting regions and the non-light-transmitting regions that are alternately arranged during the display panel displays each frame of display image.

10. A display apparatus having a display side and a non-display side, the display apparatus comprising:
  a display panel;
  a grating panel disposed at a side of the display panel, wherein when the display apparatus is in a privacy display mode, the grating panel is configured to form light-transmitting regions and non-light-transmitting regions that are alternately arranged;
  an image processor, wherein when the display apparatus is in the privacy display mode, the image processor is configured to obtain two frames of display images according to a frame of original image; and
  a display controller electrically connected to the display panel, the grating panel and the image processor, wherein when the display apparatus is in the privacy display mode, the display controller is configured to control the display panel to display the two frames of display images in sequence within a display time of the frame of original image, and to control the grating panel to form the light-transmitting regions and the non-light-transmitting regions that are alternately arranged when the display panel displays each frame of display image, so as to limit an exit angle of light exiting from the display side of the display apparatus; the exit angle is within a range of a privacy viewing angle, wherein
  the image processor being configured to obtain the two frames of display images according to the frame of original image, includes:
  the image processor being configured to divide the frame of original image into a plurality of image columns in a row direction, each image column including a plurality of continuous columns of pixels; and
  the image processor being configured to extract sequentially part of image columns from the plurality of image columns, and use sequentially columns of pixels in the part of the image columns as pixel columns of one frame of display image, the pixel columns of the one frame of display image and the columns of pixels in the part of the image columns being at same positions, and gray scales of pixel columns at remaining positions of the one frame of display image being 0;
  the two frames of display images include a first display image and a second display image; and
  the image processor being configured to extract sequentially the part of the image columns from the plurality of image columns, and use sequentially the columns of pixels in the part of the image columns as the pixel columns of the one frame of display image, the pixel columns of the one frame of display image and the columns of pixels in the part of the image columns being at the same positions, includes:
  the image processor being configured to extract odd image columns from the plurality of image columns, and use columns of pixels in the odd image columns as first pixel columns of the first display image, the first pixel columns of the first display image and the columns of pixels in the odd image columns being at same positions, and gray scales of second pixel columns at remaining positions of the first display image being 0; and
  the image processor being configured to extract even image columns from the plurality of image columns, and use columns of pixels in the even image columns as third pixel columns of the second display image, the third pixel columns of the second display image and the columns of pixels in the even image columns being at same positions, and gray scales of fourth pixel columns at remaining positions of the second display image being 0.

11. The display apparatus according to claim 10, wherein
  the grating panel includes a liquid crystal grating;
  the display panel includes a liquid crystal display panel or an organic light-emitting diode display panel; and
  the display panel and the grating panel are fixed together by an adhesive layer.

12. The display apparatus according to claim 11, wherein the display panel includes the liquid crystal display panel,
  the display panel is closer to the display side of the display apparatus than the grating panel; or the grating panel is closer to the display side of the display apparatus than the display panel; and
  the display apparatus further comprises:
  a backlight module, the backlight module being closer to the non-display side of the display apparatus than the grating panel and the display panel.

13. The display apparatus according to claim 11, wherein the display panel includes the liquid crystal display panel, the display apparatus further comprises: a polarizer disposed between the liquid crystal display panel and the grating panel;
  a polarizer is shared by a side of the liquid crystal display panel proximate to the grating panel and a side of the grating panel proximate to the liquid crystal display panel.

14. The display apparatus according to claim 11, wherein the display panel includes the organic light-emitting diode display panel,
  the grating panel is closer to the display side of the display apparatus than the display panel.

15. The display apparatus according to claim 10, wherein
  the image processor is further configured to obtain position information of a viewer's eyes within the range of the privacy viewing angle, and to transmit the position information to the display controller; and
  the display controller is further configured to generate a grating offset amount signal according to the position information, and to transmit the grating offset amount signal to the grating panel, so that the grating panel adjusts positions of the light-transmitting regions and the non-light-transmitting regions according to the grating offset amount signal.

16. The display apparatus according to claim 10, wherein
  the display controller is further configured to determine a pitch of two adjacent light-transmitting regions according to the range of the privacy viewing angle, a longitudinal distance between the display panel and the grating panel, and a width of a sub-pixel in the display panel.

17. The display apparatus according to claim 10, wherein
  the display controller is further configured to control the display panel to display the original image and control the grating panel to form a full light-transmitting region within a display time of the original image, when the display apparatus is in a shared display mode.

\* \* \* \* \*